United States Patent [19]

Taguchi et al.

[11] Patent Number: 4,619,037

[45] Date of Patent: Oct. 28, 1986

[54] METHOD OF MANUFACTURING A SEMICONDUCTOR DEVICE

[75] Inventors: Shinji Taguchi, Yokohama; Homare Matsumura, Kawasaki; Kenji Maeguchi, Yokohama, all of Japan

[73] Assignee: Kabushiki Kaisha Toshiba, Kawasaki, Japan

[21] Appl. No.: 798,728

[22] Filed: Nov. 19, 1985

Related U.S. Application Data

[63] Continuation of Ser. No. 603,699, Apr. 25, 1983, abandoned.

[30] Foreign Application Priority Data

May 31, 1981 [JP] Japan .................. 58-96126

[51] Int. Cl.$^4$ .................... H01L 21/44
[52] U.S. Cl. .................... 29/578; 29/590; 29/591; 427/90
[58] Field of Search .................... 29/578, 590, 591; 427/90

[56] References Cited

U.S. PATENT DOCUMENTS

| | | | |
|---|---|---|---|
| 3,323,198 | 6/1967 | Shortes | 427/90 X |
| 3,382,568 | 5/1968 | Kuiper | 29/578 |
| 3,865,624 | 2/1975 | Wilde | 29/591 X |
| 3,881,971 | 5/1975 | Greer et al. | 427/90 X |
| 4,184,909 | 1/1980 | Chang et al. | 427/90 X |
| 4,265,935 | 5/1981 | Hall | 427/90 X |
| 4,428,111 | 1/1984 | Swartz | 29/591 X |

FOREIGN PATENT DOCUMENTS 194551 11/1982 Japan .

Primary Examiner—George T. Ozaki
Attorney, Agent, or Firm—Finnegan, Henderson, Farabow, Garrett & Dunner

[57] ABSTRACT

A method of manufacturing a semiconductor device is disclosed. In the manufacturing method, an impurity diffusion layer as a first interconnection layer is formed on a semiconductor substrate. Then, an aluminum layer as a second interconnection layer is formed on the semiconductor substrate with an insulating film interposing therebetween. Another insulating layer is further formed on the aluminum layer. An anisotropic etching process is applied to the insulating layer, the second interconnection layer, and the insulating film, thereby forming a contact extending up to the first interconnection layer through these layers, and the insulating film. After the formation of the contact hole, an aluminum layer is formed on the entire surface of the insulating film including the inner surface of the contact hole. The aluminum layer formed in the contact hole electrically interconnects the first and second interconnecting layers.

3 Claims, 10 Drawing Figures

F I G. 4A
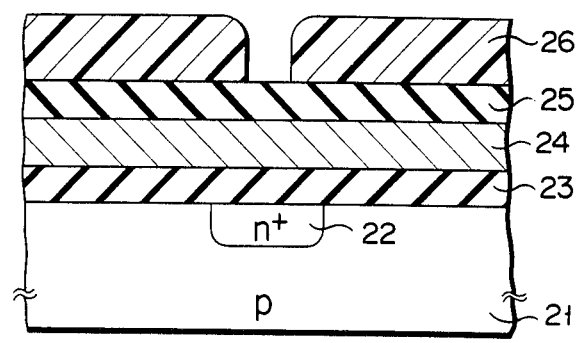
F I G. 4B
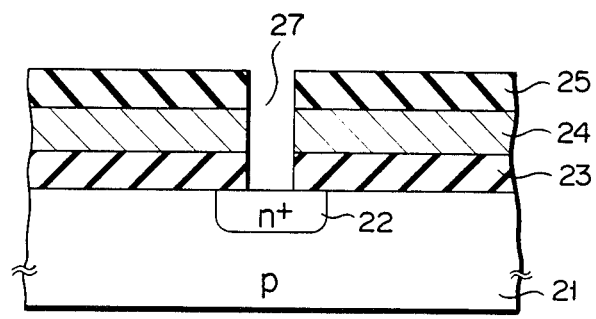
F I G. 4C
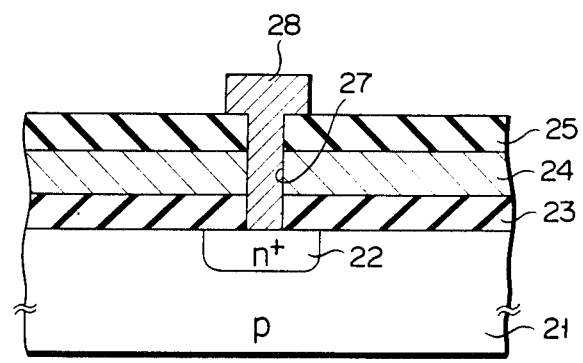

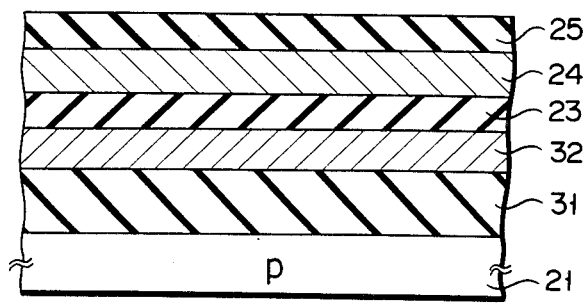
F I G. 5A
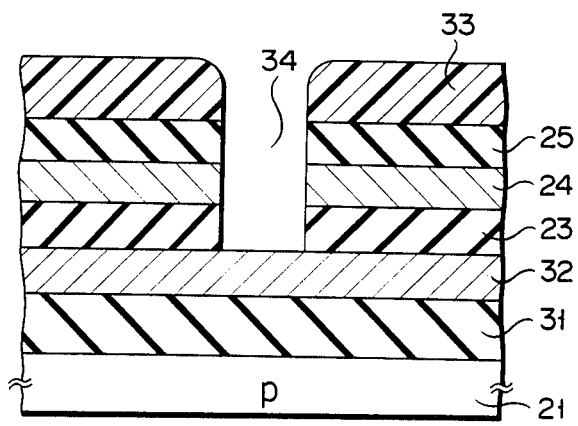
F I G. 5B
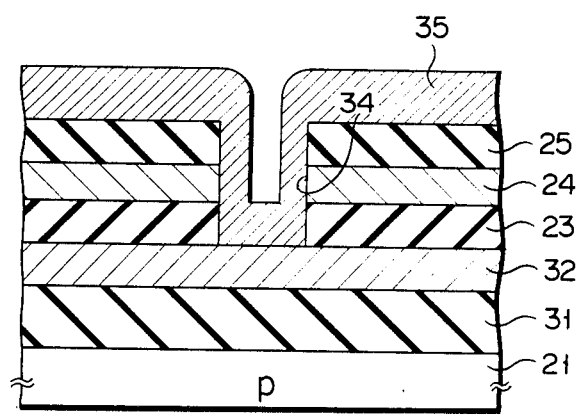
F I G. 5C
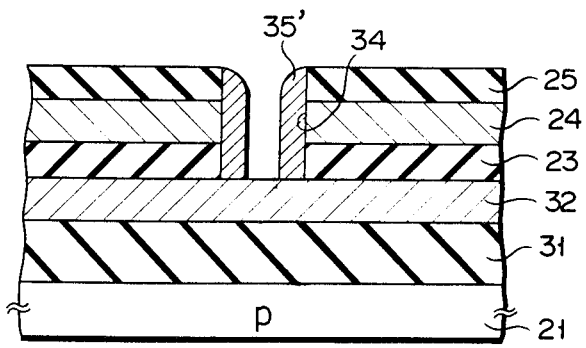
F I G. 5D

METHOD OF MANUFACTURING A SEMICONDUCTOR DEVICE

This application is a continuation of application Ser. No. 603,699, filed Apr. 25, 1983 now abandoned.

BACKGROUND OF THE INVENTION

The present invention relates to a method of manufacturing a semiconductor device, and more particularly to a method of manufacturing a semiconductor device having a multi-layer structure.

A prior multi-layer semiconductor device, e.g., having a two-layered interconnection structure is shown in FIG. 1. As shown, a first interconnection layer 3 (conductive layer) is formed on a semiconductor substrate 1 with an insulating film 2 interposed therebetween. An interlaying insulating film 4 is formed over the entire upper surface of the first interconnection layer 3. Then, the insulating film 4 is masked and etched at a predetermined location thereof to form a first contact hole 5. Metal, for example, aluminum, is deposited over the entire upper surface of the insulating film 4 containing the first contact hole 5. The aluminum layer formed is patterned to form a second interconnection layer (conductive layer) 6. In the depositing process for forming the second interconnection layer 6, the aluminum penetrates into the first contact hole 5 to stick to the exposed portion of the first interconnection layer 3 and to the inner side wall of the insulating film 4, thereby interconnecting the first interconnection layer 3 and the second interconnection layer 6.

According to the prior manufacturing method, however, while the aluminum is being deposited to form the second interconnection layer 6, some aluminum hangs over the upper peripheral edge of the first contact hole 5, as shown in FIG. 2. The overhanging aluminum hinders aluminum deposition on the inner side wall of the first contact hole 5, preventing the formation of aluminum film there or permitting only a very thin aluminum film to be formed. Therefore, the second interconnection layer 6 tends to disconnect from the inner side wall of the first contact hole 5. Even if the second interconnection layer 6 is not disconnected, the semiconductor device tends to be destroyed during the course of operation. The reason for this is that the thin aluminum deposited layer on the inner side wall of the first contact hole 5 has a high current density when the device is operated, and the large amount of Joule heat generated destroys the thin film. In this respect, the prior semiconductor device involves a problem in reliability.

Another prior art of the multi-layer semiconductor device having three-layers is illustrated in FIG. 3. As shown, the first interconnection layer 3 is layered on the insulating film 2 formed on the substrate 1. The insulating film 4 is then formed on the first interconnection layer 3 and is maksed and etched at a proper location to form the first contact hole 5. Then, the second interconnection layer 6 is formed on the insulating film 4, connecting with the first interconnection layer 3 through the first contact hole 5. Then, an insulating layer 7 is formed over the entire upper surface of the second interconnection layer 6. In the next step, a second contact hole 8, which is larger than the first contact hole 5, is formed in the insulating layer 7 at the location just above the first contact hole 5 of the insulating film 4. Aluminum is deposited over the entire upper surface of the insulating layer 7 including the second contact hole 8. In turn, the aluminum film is patterned to form a third interconnection layer 9 interconnecting with the second interconnection layer 6.

High intergration density is one of the most important requirements in the fabrication of the integrated circuits. Therefore, it is desirable that the holes 5 and 8 be as small as possible. In this respect, as in the prior art case, it is necessary that the diameter of the second contact hole 8 be at least equal to that of the first contact hole 5.

To form the second contact hole 8, the following process steps are taken. A photoresist film is first formed on the insulating layer 7. Then, a mask with a predetermined pattern is applied onto the photoresist film. The insulating layer 7 having the mask-layered photoresist film is exposed to light. Finally, a portion of the insulating layer 7 where the second contact hole 8 is to be formed is etched away to form the same hole 8. In the exposing step in the above fabricating process, light irregularly reflects on the second interconnection layer 6, making the diameters of the holes 5 and 8 unequal to each other. Further, it is required that the hole formed in the photoresist has a large enough diameter to prevent irregular reflection. Therefore, the diameter of the second contact hole 8 formed is necessarily larger than the first contact hole 5.

SUMMARY OF THE INVENTION

Accordingly, an object of the present invention is to provide a method of manufacturing a high density semiconductor device whose interconnection layer will not be interrupted or disconnected, therefore providing a good connection between the interconnection layers.

According to the invention, there is provided a method of manufacturing a semiconductor device comprising the steps of forming a first interconnection layer on a semiconductor substrate, forming a second interconnection layer on said substrate containing said first interconnection layer with an insulating film interlaying between them, forming a contact hole by etching said insulating film and said second interconnection layer in a step, and forming a conductive layer over the entire upper surface of a semiconductor structure containing said contact hole formed therein, thereby interconnecting said first and second interconnection layers.

BRIEF DESCRIPTION OF THE DRAWINGS

FIGS. 4A–4C illustrate in cross-section the manufacturing sequence according to the present invention; and FIGS. 5A–5D illustrate in cross-section a manufacturing sequence of another method according to the present invention.

DETAILED DESCRIPTION OF THE PREFERRED EMBODIMENTS

Figure 1:
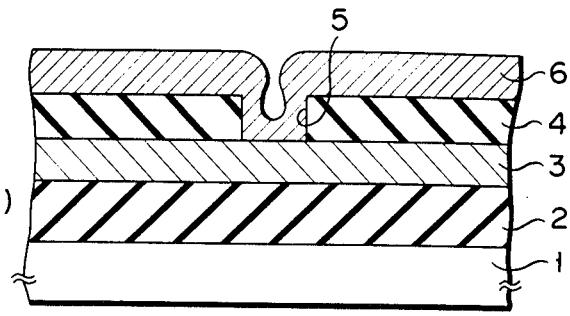
FIG. 1 is a cross-sectional view of a prior art semiconductor device of the double-layer structure.
Figure 2:
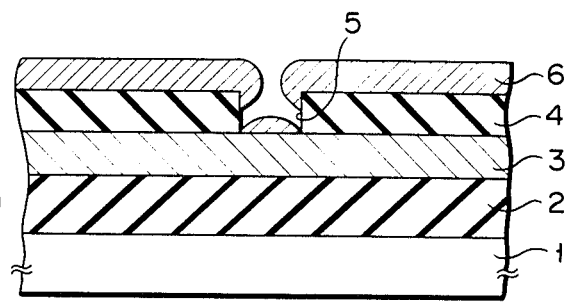
FIG. 2 is a cross-sectional view of the semiconductor device of FIG. 1 which illustrates a conductive film that is interrupted.
Figure 3:
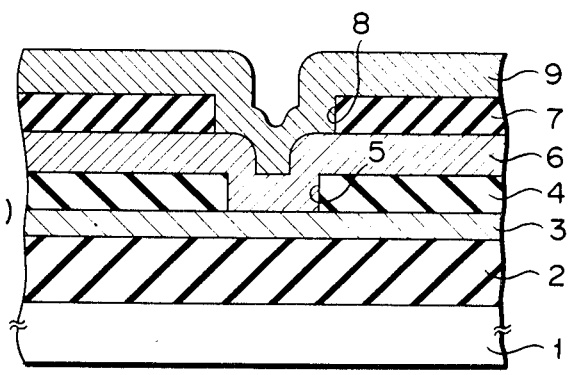
FIG. 3 illustrates a cross-section of a prior art semiconductor device having a multi-layer structure.

Two methods of manufacturing a semiconductor device having a double-layer structure will be described referring to FIGS. 4A to 4C and 5A to 5D.

Embodiment I (i) (FIG. 4A)

An N-conductivity type impurity diffusion layer (conductive layer) 22 as a high concentration impurity layer with a depth of 0.3 μm is formed as a first interconnection layer on the surface region of the P-conductivity type silicon (Si) substrate 21 by thermally diffusing an impurity into the surface of the substrate 21.

A first $SiO_2$ film 23 of a 9,000 Å thickness is formed as an insulating film on the Si substrate 21 containing the diffusion layer 22 by the CVD (chemical vapor deposition) method. Then, aluminum containing silicon is deposited over the entire upper surface of the first $SiO_2$ film 23. The aluminum is patterned to form a second interconnection layer 24 of about 9,000 Å in thickness. Further, an $SiO_2$ film 25 of 8,500 Å in thickness is formed on the second interconnection layer 24 by the CVD method. Subsequently, a photoresist film 26 is formed on the entire upper surface of the $SiO_2$ film 25. Then, the photoresist layer 26 is engraved by the photo engraving process (PEP) to form a contact hole right above the diffusion layer 22 in the Si substrate 21. In this way, a photoresist layer 26 with a predetermined pattern is formed.

(ii) (FIGS. 4A and 4B)

Then, a contact hole of 1.5 μm in diameter is formed, extending through the layers 23 to 25 to the diffusion layer 22. To form this hole, the photoresist layer 26 was used as a mask, and then an anisotropic etching method, for example, a reactive ion etching (RIE) method, was used. Then, the photoresist layer 26 is removed from the $SiO_2$ film 25. The etching method at this stage is not limited to the RIE method, but it is preferable to use the anisotropic etching method in order to obtain a contact hole with a uniform diameter for its entire depth. Generally, the etching conditions for $SiO_2$ of the films 23 and 25, and for the Al of the layer 24 differ. The etching process could be done in one step by properly selecting the etching gas and etching time according to the layer and films to be etched. Subsequently, the structure is subjected to high temperature. Under this heated condition, aluminum containing silicon is deposited over the entire upper surface of the $SiO_2$ film 25 and in the contact hole 27 by the CVD method. Then, the aluminum layer over the structure is patterned, and an aluminum interconnection layer 28 of 8,000 Å in thickness is formed. The aluminum interconnection layer 28 sufficiently fills the contact hole 27 to ensure the interconnection of the diffusion layer 22 and the second interconnection layer 24. Through the above process steps, the semiconductor device as shown in FIG. 4C is manufactured.

As described above, for forming the contact hole 27, the first $SiO_2$ film 23, the second interconnection layer 24, and the $SiO_2$ film 25 are layered on the Si substrate 21 having the diffusion layer 22 of the N+ type formed on the surface region. Then, using the photoresist layer 26 as a mask, the $SiO_2$ film 25, the second interconnection layer 24, and the first $SiO_2$ film 23 are etched in a single step by the RIE method. Therefore, the diameter of the contact hole 27 ranging from the $SiO_2$ film 25 to the diffusion layer 22 is uniform over its entire depth. Thus, the problem of the prior art occurring when the diameter of the contact hole in the second insulating film is larger than that in the first insulating film, is successfully solved. Therefore, according to the above embodiment, the integration density can be improved.

In the step of forming the aluminum interconnection layer 28 following the formation of the contact hole 27, aluminum is deposited over the entire upper surface of the uppermost layer of the structure, while the structure is being heated. Therefore, the contact hole 27 is completely filled with aluminum, thus eliminating the discontinuity which otherwise would occur between the diffusion layer 22 and the second interconnection layer 24.

Embodiment II (i) (FIGS. 5A and 5B)

The first $SiO_2$ layer 31 is layered over the P-conductivity type Si substrate 21 with the first interconnection layer 32. A second $SiO_2$ film 23 as an interlaying insulating film is formed over the first interconnection layer 32. Aluminum containing silicon Si, for example, is deposited over the second $SiO_2$ film 23, and then is patterned to form the second interconnection layer 24 (FIG. 5A). A third $SiO_2$ film 25 is formed over the second interconnecting layer 24. Then, the entire upper surface of the structure is coated with a photoresist material and patterned by the PEP to form a photoresist film 33 with a predetermined pattern. In the next step, the RIE process is applied to the third $SiO_2$ film 25, the second interconnection layer 24 and the second $SiO_2$ film 23, using the photoresist pattern 33 as a mask. In this way, the contact hole 34 is formed. The contact hole 34 allows the first interconnection layer 32 to be exposed (FIG. 5B).

(ii) (FIGS. 5C and 5D)

Following the above step, the photoresist pattern 33 is removed from the structure, and is subjected to a high temperature. Under this heated condition, aluminum containing silicon is deposited by the CVD method over the entire upper surface of the second $SiO_2$ film 25, thereby forming an aluminum layer 35 as a conductive layer. During this aluminum depositing process, the inner side wall of the contact hole 34 is satisfactorily coated with aluminum (FIG. 5C). The aluminum layer 35 is etched by the RIE method until the surface of the second $SiO_2$ film 25 is exposed leaving some aluminum on the inner wall of the contact hole 34. The residual aluminum layer 35' reliably interconnects the first and second interconnection layers 32 and 24 (FIG. 5D).

Also in the second embodiment, in order to form the contact hole 34, the third $SiO_2$ film 25, the second interconnection layer 24 and the second $SiO_2$ film 23 are etched in a single step, while using the second $SiO_2$ film 23 as a mask. This process makes the diameter of the contact hole 34 substantially equal over its entire depth. This results in a semiconductor device having high integration density. After the contact hole 34 is formed, aluminum is deposited over the heated structure, that is, over the entire upper surface of the second $SiO_2$ film 25 of the structure. This process permits the formation of a residual aluminum layer 35' with a satisfactory thickness. The result is the elimination of the disconnection between the first interconnection layer 32 and the second interconnection layer 24.

The CVD method used for forming the aluminum interconnection layer 28 and the aluminum layer 35 may be replaced by any other method if the material used can enter the contact hole in a sufficient amount and can attach itself to the inner side wall and the bottom of the contact hole. Such replaceable methods are, for example, the vapor depositing method and the sputtering method. Additionally, aluminum containing silicon used for the layers 24, 28, 32 and 35 may be substituted by pure aluminum, any metal having a high melting point, metal silicide, polysilicon, etc. It is evident that the present invention is applicable to an interconnection structure having three or more layers. The present invention is also applicable to a three-dimensional integrated circuit in which circuit elements are arranged in a three-dimensional fashion. The present invention of course is applicable for manufacturing a semiconductor device whose layers are formed on an insulating substrate made of sapphire.

As seen from the foregoing description, according to the present invention, the semiconductor device has many layers with the insulating layers interlaying among them. To form the contact hole, the multilayer structure is subjected to only one step of the etching process. Therefore, the contact hole formed has a substantially uniform diameter over its entire depth. Further, the aluminum depositing process step is executed while the structure is sufficiently heated after the formation of the contact hole. This feature ensures the formation of a metal film having a satisfactory thickness on the inner side wall of the contact hole, and eliminates possibility of the interconnection layers becoming disconnected.

While the present invention has been described using specific embodiments, the present invention may of course be variously changed, altered and modified within the scope of the invention.

What is claimed is:

1. A method for connecting first and second interconnection layers of an integrated circuit device comprising the steps of:
   forming said first interconnection layer of a predetermined pattern,
   forming a first insulation film on said first interconnection layer,
   forming said second interconnection layer of a predetermined pattern on said first insulation film,
   forming a second insulation film on said second interconnection layer,
   forming a photoresist layer as a mask on said second insulation film, with a contact opening,
   forming a contact hole of uniform diameter in one continuous step extending through said second insulation film, said second interconnection layer, and said first insulation film,
   removing said photoresist layer, and
   forming a conductive layer of a predetermined pattern extending into said contact hole and connecting said first and second interconnection layers together.

2. A method for interconnecting layers of an integrated circuit device according to claim 1, wherein said first interconnection layer is a semiconductor region formed in a semiconductor substrate and has a conductivity type opposite to that of the semiconductor substrate.

3. A method for interconnecting layers of an integrated circuit device according to claim 1, wherein said first interconnection layer is a conductive layer formed on an insulation film formed on a semiconductor substrate.

* * * * *

UNITED STATES PATENT AND TRADEMARK OFFICE
CERTIFICATE OF CORRECTION

PATENT NO. : 4,619,037
DATED : October 28, 1986
INVENTOR(S) : SHINJI TAGUCHI ET AL It is certified that error appears in the above-identified patent and that said Letters Patent is hereby corrected as shown below:

On the Title Page, under the title "Foreign Application Priority Data":

"May 31, 1981 [JP] Japan ......................58-96126"
should read -- May 31, 1983 [JP] ................58-96126 --.

Signed and Sealed this

Twenty-first Day of April, 1987

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,619,037

DATED : October 28, 1986

INVENTOR(S) : SHINJI TAGUCHI ET AL

It is certified that error appears in the above-identified patent and that said Letters Patent is hereby corrected as shown below:

On the Title Page, under the title "Related U.S. Application Data":

"Continuation of Ser. No. 603,699, Apr. 25, 1983, abandoned." should read -- Continuation of Ser. No. 603,699, Apr. 25, 1984, abandoned. --

Signed and Sealed this

Eleventh Day of August, 1987

Attest:

DONALD J. QUIGG

Attesting Officer

Commissioner of Patents and Trademarks